United States Patent
Takao et al.

(10) Patent No.: US 10,075,103 B2
(45) Date of Patent: Sep. 11, 2018

(54) POWER GENERATION DEVICE FOR MOBILE BODY

(71) Applicants: TOYODA IRON WORKS CO., LTD., Toyota-shi, Aichi-ken (JP); NATIONAL UNIVERSITY CORPORATION HIROSHIMA UNIVERSITY, Higashi-Hiroshima-shi, Hiroshima (JP)

(72) Inventors: Hidenobu Takao, Toyota (JP); Yasuhiro Sone, Toyota (JP); Hidemi Mutsuda, Higashi-Hiroshima (JP); Yoshikazu Tanaka, Higashi-Hiroshima (JP)

(73) Assignees: TOYODA IRON WORKS CO., LTD., Toyota-shi (JP); NATIONAL UNIVERSITY CORPORATION HIROSHIMA UNIVERSITY, Hiroshima (JP)

( * ) Notice: Subject to any disclaimer, the term of this patent is extended or adjusted under 35 U.S.C. 154(b) by 275 days.

(21) Appl. No.: 15/031,831

(22) PCT Filed: Jul. 14, 2014

(86) PCT No.: PCT/JP2014/068751
§ 371 (c)(1),
(2) Date: Apr. 25, 2016

(87) PCT Pub. No.: WO2015/068427
PCT Pub. Date: May 14, 2015

(65) Prior Publication Data
US 2016/0268932 A1 Sep. 15, 2016

(30) Foreign Application Priority Data
Nov. 8, 2013 (JP) .................................. 2013-232379

(51) Int. Cl.
*H01L 41/113* (2006.01)
*H02N 2/18* (2006.01)
(Continued)

(52) U.S. Cl.
CPC .............. *H02N 2/185* (2013.01); *B60L 8/006* (2013.01); *B60R 19/52* (2013.01); *F03D 5/00* (2013.01);
(Continued)

(58) Field of Classification Search
CPC .............. H01L 41/113; H01L 41/1132; H01L 41/1134; H01L 41/1136; H01L 41/1138; H02N 2/18
(Continued)

(56) References Cited

U.S. PATENT DOCUMENTS 5,223,763 A * 6/1993 Chang .................... H02N 2/185
310/339
2008/0277941 A1 11/2008 Bowles et al.
(Continued)

FOREIGN PATENT DOCUMENTS

| CN | 101341331 A | 1/2009 |
| CN | 103168167 A | 6/2013 |

(Continued)

OTHER PUBLICATIONS

Jul. 3, 2017 Office Action issued in Chinese Patent Application No. 201480059428.1.
(Continued)

*Primary Examiner* — Derek Rosenau
(74) *Attorney, Agent, or Firm* — Oliff PLC

(57) ABSTRACT

A power generation device for a mobile body includes power generating units and a holding member. Each power generating unit includes an elastically deformable base member and a piezoelectric film, which are laminated alter- (Continued)

nately. The holding member holds the power generating units. Each power generating unit has an elongated flat-plate shape. Opposite ends of the power generating unit in a longitudinal direction are held by the holding member such that the power generating unit is in an orientation in which a longitudinal axis is substantially perpendicular to the flow direction of the external fluid. A fixing member is provided at each of the opposite ends in the longitudinal direction of each power generating unit. The power generating units are arranged in the holding member via the fixing members to pivot in accordance with the flow of the external fluid.

4 Claims, 10 Drawing Sheets

(51) Int. Cl.
*B60R 19/52* (2006.01)
*F03D 5/00* (2006.01)
*B60L 8/00* (2006.01)
*H01L 41/053* (2006.01)

(52) U.S. Cl.
CPC .......... *H01L 41/053* (2013.01); *H01L 41/113* (2013.01); *H01L 41/1134* (2013.01); *H02N 2/186* (2013.01); *B60R 2019/525* (2013.01); *Y02E 10/70* (2013.01)

(58) Field of Classification Search
USPC ........................................................ 310/339
See application file for complete search history.

(56) References Cited

U.S. PATENT DOCUMENTS

| | | |
|---|---|---|
| 2009/0140604 A1 | 6/2009 | Chen et al. |
| 2010/0109482 A1 | 5/2010 | Sunaga |
| 2012/0086310 A1 | 4/2012 | Allaei |
| 2012/0230021 A1* | 9/2012 | Lynch .................... F03B 17/06 362/183 |

FOREIGN PATENT DOCUMENTS

| | | |
|---|---|---|
| JP | 2007-198175 A | 8/2007 |
| JP | 2008-030640 A | 2/2008 |
| JP | 2010-209786 A | 9/2010 |
| JP | 2013-009569 A | 1/2013 |
| KR | 20130010258 A | 1/2013 |

OTHER PUBLICATIONS

Nov. 10, 2017 Office Action issued in Chinese Patent Application No. 201480059428.1.
Sep. 30, 2014 Search Report issued in International Patent Application No. PCT/JP2014/068751.
May 8, 2017 Search Report issued in European Patent Application No. 14860628.8.

* cited by examiner

Flow Direction of Outside Air

POWER GENERATION DEVICE FOR MOBILE BODY

TECHNICAL FIELD

The present invention relates to a power generation device for a mobile body, and more particularly to a technique for configuring a light and compact power generation device that produces a large electromotive force.

BACKGROUND ART

A type of power generation device for a mobile body has been proposed that generates power based on a relative flow of external fluid when the mobile body travels. Patent Document 1 discloses such a device, which includes a wind turbine arranged under the hood of a vehicle. The wind turbine is rotated by a flow of outside air during traveling and generates power. Patent Document 2 discloses a configuration including power generation devices of an electromagnetic induction type arranged in the supporting portions at both ends of a rear spoiler. In this configuration, the energy of vertical vibrations of the rear spoiler caused by a flow of outside air during traveling is converted into electrical energy.

PRIOR ART DOCUMENTS

Patent Documents

Patent Document 1: Japanese Laid-Open Patent Publication No. 2010-209786
Patent Document 2: Japanese Laid-Open Patent Publication No. 2008-30640

SUMMARY OF THE INVENTION

Problems that the Invention is to Solve

However, the technique of Patent Document 1 increases the weight and the traveling resistance, resulting in lower fuel efficiency. Since the technique of Patent Document 2 includes the power generation devices in the supporting portions at the ends of the rear spoiler, the electromotive force cannot be easily increased by providing additional power generation devices.

Accordingly, it is an objective of the present invention to provide a light and compact power generation device for a mobile body that generates power based on a relative flow of external fluid when the mobile body travels and easily produces a large electromotive force.

Means for Solving the Problems

To achieve the foregoing objective, a first invention provides a power generation device for a mobile body that generates power based on a relative flow of an external fluid when the mobile body travels. The first invention is characterized by (a) a plurality of flat-plate shaped power generating units, each of which includes an elastically deformable flat-plate shaped base member and a piezoelectric film, wherein the base member and the piezoelectric film are laminated alternately, and when the base member is elastically deformed in a thickness direction by a flow of the external fluid, the piezoelectric film is warped to generate power and (b) a holding member, which is arranged in the mobile body, wherein the power generating units are arranged in a direction intersecting the flow direction of the external fluid and spaced apart, and the holding member holds the power generating units at a position where the external fluid flows such that flat surfaces of flat-plate shapes of the power generating units are oriented to be substantially parallel with the flow direction of the external fluid.

The flat-plate shape refers to the shape of each power generating unit when not being deformed by the external fluid and to a standard shape held by the holding member.

A second invention is characterized in that, in the power generation device for a mobile body according to the first invention, the power generating units are arranged in the holding member to be in a fixed orientation at which the flat surfaces of the flat-plate shapes are parallel with each other and substantially parallel with the flow direction of the external fluid.

A third invention is characterized in that, in the power generation device for a mobile body according to the first invention, each power generating unit has an elongated flat-plate shape, and opposite ends of the elongated flat-plate shape in a longitudinal direction are held by the holding member such that the power generating unit is in an orientation in which a longitudinal axis is substantially perpendicular to the flow direction of the external fluid.

A fourth invention is characterized in that, in the power generation device for a mobile body according to the third invention, with respect to a width direction, which is perpendicular to the longitudinal direction, a part in the opposite ends of the elongated flat-plate shape in the longitudinal direction that is located on an upstream side in the flow direction of the external fluid is fixed to the holding member, and a part that is located on a downstream side is movable in a thickness direction and relative to the holding member.

A fifth invention is characterized in that, in the power generation device for a mobile body according to any one of the first to fourth inventions the holding member has a rectangular frame-like shape as viewed from a front of the mobile body, and the holding member holds the power generating units such that the longitudinal direction of the mobile body agrees with the flow direction of the external fluid.

A sixth invention is characterized in that, in the power generation device for a mobile body according to any one of the first to fifth inventions, (a) the mobile body is a vehicle with a front grille having substantially horizontal lateral fins or substantially vertical fins and (b) the power generation device is arranged rearward of the front grille, the power generating units are oriented such that the flat surfaces are substantially parallel with the fins, as viewed from the front of the vehicle, opposite ends of the power generating units in a direction parallel with the fins are held by the holding member, and the power generating units generate power by being deformed by a flow of the outside air that is drawn in through clearances of the fins.

A seventh invention is characterized in that, in the power generation device for a mobile body according to the sixth invention, in a cross-sectional view taken along a longitudinal axis of the vehicle, each fin has an inclined portion, wherein a distance between the inclined portion and a center of the power generation device decreases toward a rear end of the vehicle.

Effects of the Invention

The above described power generation device for a mobile body uses the flat-plate shaped power generating units, each of which includes an elastically deformable base member and a piezoelectric film, and the base member and the piezoelectric film are laminated alternately. This configuration allows the power generation device to be light and compact. When the base member is elastically deformed in the thickness direction by a flow of the external fluid, the piezoelectric film is warped to generate power. The power generating units are arranged in a direction intersecting the flow direction of the external fluid and spaced apart. The power generating units are also held by the holding member such that the flat surfaces of the flat-plate shapes are oriented to be substantially parallel with the flow direction of the external fluid. This configuration allows the multiple power generating units to be densely arranged in close proximity to one another while limiting increase in the moving resistance of the mobile body. As a result, a great electromotive force is readily produced.

According to the second invention, the power generating units are arranged in the holding member to be in the fixed orientation at which the flat surfaces of the flat-plate shapes are parallel with each other and substantially parallel with the flow direction of the external fluid. This allows the multiple power generating units to be densely arranged without contacting each other, so that a greater electromotive force can be ensured in the limited arrangement space.

According to the third invention, each power generating unit has an elongated flat-plate shape and is oriented such that its longitudinal axis is substantially perpendicular to the flow direction of the external fluid. In this state, the opposite ends in the longitudinal direction are held by the holding member. Thus, the intermediate portion in the longitudinal direction of each power generating unit is vibrated by the flow of the external fluid in a favorable manner to be deformed in a reciprocal manner in the thickness direction. The power generating unit therefore efficiently generates power.

According to the fourth invention, with respect to a width direction that is perpendicular to the longitudinal direction, a part in the opposite ends of the elongated flat-plate shape in the longitudinal direction that is located on the upstream side in the flow direction of the external fluid is fixed to the holding member. A part that is located on the downstream side is movable in the thickness direction and relative to the holding member. Accordingly, the deformation range of the piezoelectric film is increased, which allows piezoelectric film to efficiently generate power.

According to the fifth invention, the holding member has a rectangular frame-like shape as viewed from the front of the mobile body. The holding member holds the power generating units such that the longitudinal direction of the mobile body agrees with the flow direction of the external fluid. This facilitates handling of the power generation device. For example, in the case of an electric vehicle, which requires no radiator, the power generation device can be installed in a radiator support designed for an engine driven vehicle. Thus, the power generation device can be easily and inexpensively installed in a vehicle using conventional parts.

The sixth invention relates to a vehicle with a front grille having lateral fins or vertical fins. The power generating units are oriented to be substantially parallel with the fins. As viewed from the front of the vehicle, the opposite ends in the direction parallel with the fins are held by the holding member. This allows the power generating units to be efficiently deformed by the outside air introduced through the clearances of the fins, which increases the power generation efficiency. Also, the flow of the outside air can be controlled by the fins. This allows power to be further efficiently generated.

According to the seventh invention, each fin has an inclined portion, and the distance between the inclined portion and the center of the power generation device decreases toward the rear end of the vehicle. This increases the wind velocity (flow rate) of the outside air when passing through the power generation device, and the flow is concentrated at the center portions of the power generating units. Also, turbulence such as swirls is likely to be generated. This increases the amount of deformation, the speed of deformation, and the frequency of the power generating units, allowing power to be further efficiently generated.

MODES FOR CARRYING OUT THE INVENTION

Figure 1:
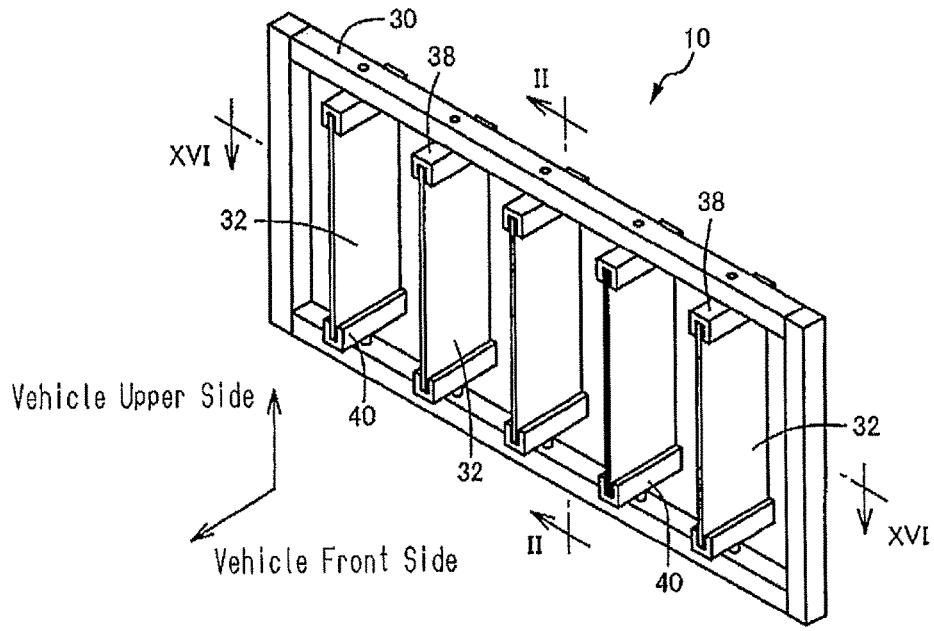
FIG. 1 is a schematic perspective view of a power generation device for a vehicle according to one embodiment of the present invention.

The present invention is applied to a power generation device mounted in a vehicle such as an automobile, but is also applicable to power generation devices for other mobile bodies such as aircrafts and ships. The power generation device may be externally attached to the outer side of these mobile bodies, such as a part close to a wing. Alternatively, the power generation device may be provided in an external fluid passage inside the mobile body. The power generation devices of the present invention may be provided both outside and inside a mobile body.

For example, an elastomer such as natural rubber and a synthetic rubber or silicone is suitably used for base members. Depending on the hardness of the base members, the deformation characteristics and the power generation characteristics in relation to the flow rate of external fluid vary. Thus, a combination of different types of power generating units having several types of base members of different hardnesses achieves efficient power generation in a wide range of flow rate. For example, in a case of a vehicle, base members having a Shore-A hardness in a range from 10 to 70 are favorable. In a low wind velocity range, a low hardness material having a Shore-A hardness of 15 is favorable. In a high wind velocity range, a high hardness material having a Shore-A hardness of 60 is favorable. Several types of power generating units using base members made of these materials may be combined to constitute the power generation device. Nevertheless, the power generation device may be constituted by power generating units of a single type that uses a single type of base member. In this case, for example, a low hardness material capable of generating power from a low wind velocity region to a high wind velocity region is used. The hardness of the base members is determined in a suitable manner such that desired deformation characteristics are obtained by a flow of a fluid, while taking into consideration the type (liquid or gas) and the flow rate of the fluid.

A piezoelectric film is made of a piezoelectric material having a piezoelectric effect, and materials such as polyvinylidene difluoride (PVDF) and polyvinylidene cyanide are favorable. Electrode films, which are made, for example, of aluminum, are provided on both sides of the piezoelectric film through vapor deposition, sputtering, or application of an electrically conductive paste, and electric wires are connected to the electrode films. A lamination of at least one layer of the base member and at least one layer of the piezoelectric film is sufficient for carrying out the invention. However, to increase the power generation efficiency, it is preferable that two or more layers of the piezoelectric films be provided to constitute at least a three-layer structure with one layer of the base member. In the case of a three-layer structure, a piezoelectric film simply needs to be bonded to either side of the base member.

The power generating unit having the laminated base member and piezoelectric films preferably has an elongated flat-plate shape as in the third invention. However, various types of flat-plate shape such as a square shape may be used. Although the power generating units are arranged such that the flat surfaces are oriented substantially parallel with the flow direction of the external fluid, the flow direction is not necessarily constant. Thus, for example, the power generating units may be arranged such that the flat surfaces are inclined in a range of ±15° (30° in total) with respect to the reference flow direction (for example, the longitudinal direction of the vehicle). According to the second invention, the power generating units are arranged in the holding member to be in the fixed orientation such that the flat surfaces are substantially parallel with the flow direction of the external fluid. However, in other embodiments of the present invention, the power generating units may be arranged in the holding member to pivot in accordance with the flow of the external fluid. In this case, three or more power generating units are preferably provided to ensure sufficient electromotive force.

According to the fourth invention, with respect to the width direction, which is perpendicular to the longitudinal direction, a part that is located on the upstream side in the flow direction of the external fluid is fixed to the holding member, and a part that is located on the downstream side is movable in the thickness direction and relative to the holding member. In other embodiments of the present invention, the entire areas of the ends in the longitudinal direction, that is, the areas over the entire width from the upstream end to the downstream end, may be fixed to the holding member. According to the fifth invention, the holding member has a rectangular frame-like shape as viewed from the front of the mobile body. However, the holding member may have any frame-like shape, for example, a triangle, a trapezoid, a pentagon, and a rhombus.

According to the sixth invention, the power generating units are oriented to be substantially parallel with the fins as viewed from the front of the vehicle. In other embodiments of the present invention, the power generating units may be oriented to be substantially perpendicular to the fins as viewed from the front. That is, in a case in which a front grille with lateral fins is used, two or more power generating units may be substantially vertically arranged. Also, in a case in which a front grille with vertical fins is used, two or more power generating units may be substantially horizontally arranged. According to the seventh invention, each fin has an inclined portion, and the distance between the inclined portion and the center of the power generation device decreases toward the rear end of the vehicle. In other embodiments of the present invention, substantially horizontal or substantially vertical fins without inclined portions may be provided. The lateral fins are flat-plate shaped members, which have a predetermined width in the vehicle longitudinal direction and are arranged substantially horizontally in the vehicle lateral direction, while being spaced apart in the vertical direction. The vertical fins are flat-plate shaped members, which have a predetermined width in the vehicle longitudinal direction and are arranged substantially vertically in the vehicle vertical direction, while being spaced apart in the vehicle lateral direction. In either case, the fins may be coupled to each other at intermediate portions by coupling ribs. In other embodiments of the present invention, a lattice-type front grille or a honeycomb-type front grille having neither lateral fins nor vertical fins may be used.

EMBODIMENTS

One embodiment of the present invention will now be described with reference to the drawings. In the following embodiments, structures illustrated in the drawings are simplified or modified as necessary for the purposes of illustration, and the dimensional ratios and the shapes of respective parts are not necessarily illustrated in an accurate manner.

Figure 2:
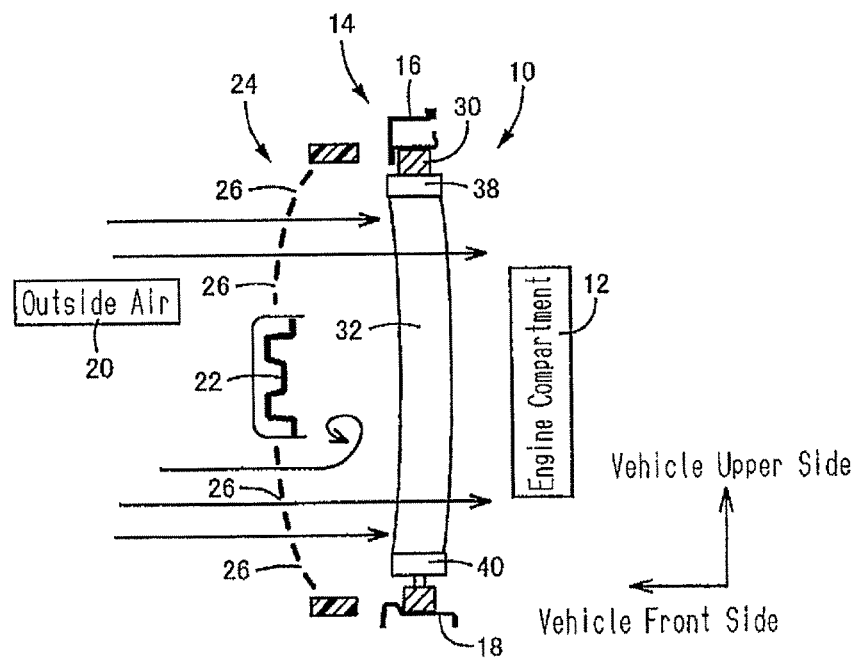
FIG. 2 is a cross-sectional view along arrows II in FIG. 1, schematically showing the power generation device of FIG. 1 installed in a vehicle.

FIG. 1 is a schematic perspective view of a power generation device 10 for a vehicle according to one embodiment of the present invention. As shown in FIG. 2, the power generation device 10 is arranged at the front end of an engine compartment 12 of a vehicle. FIG. 2 is a cross-sectional view along arrows II in FIG. 1. The vehicle is an electric vehicle, which requires no radiator. In the present embodiment, the power generation device 10 is installed in a radiator support 14, which is designed to receive a radiator. FIG. 2 illustrates an upper support 16 and a lower support 18 of the radiator support 14, which is fixed, for example, to the frame of the vehicle. The power generation device 10 generates power based on relative flow of the outside air 20 when the vehicle, which is a mobile body, travels. A great number of external introducing portions (holes or slits) 26 are formed in a front grille 24 arranged from above to below a bumper reinforcement 22 at the front end of the vehicle. As indicated by arrows, the outside air 20 is conducted into engine compartment 12. The power generation device 10 is arranged to protrude upward and downward from the bumper reinforcement 22. The outside air 20 corresponds to an external fluid. Although the electric vehicle has no engine, the term "engine compartment," which refers to a conventional compartment for accommodating an engine, is used in the present description.

Figure 3:
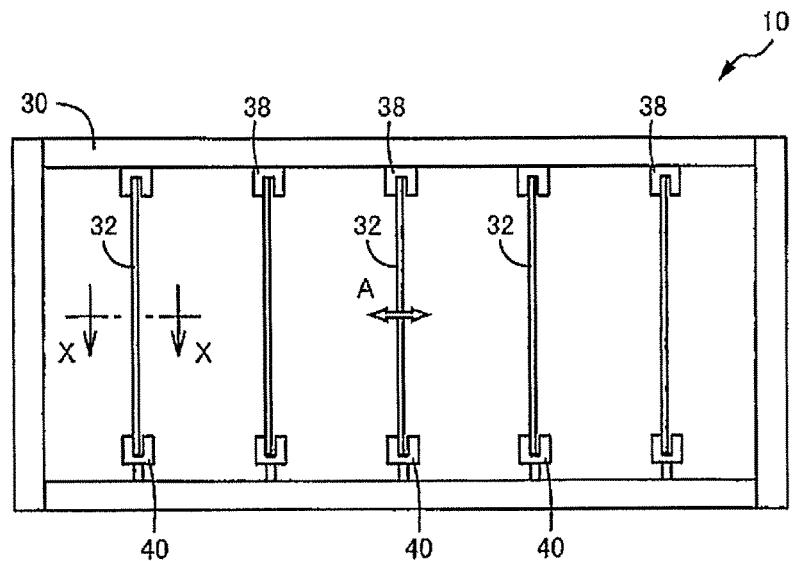
FIG. 3 is a front view of the power generation device of FIG. 1.
Figure 4:
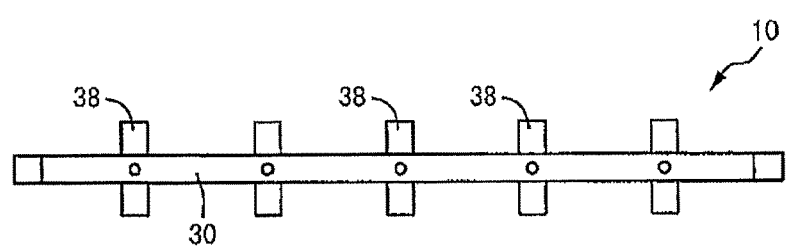
FIG. 4 is a plan view of the power generation device of FIG. 1.
Figure 5:
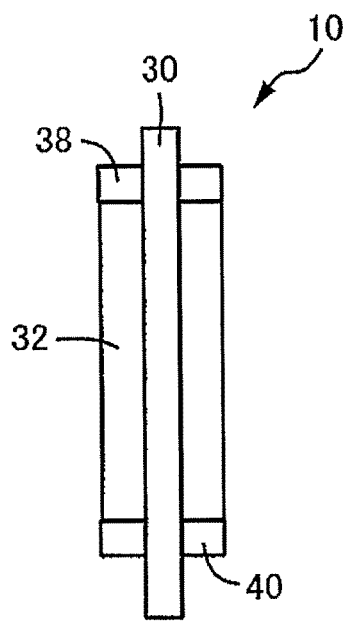
FIG. 5 is a side view of the power generation device of FIG. 1.

FIG. 3 is a front view of the power generation device 10. FIGS. 4 and 5 are a plan view and side view, respectively. As shown in these drawings, the power generation device 10 includes a holding member 30 having a rectangular frame-like shape and multiple (five in the present embodiment) power generating units 32 held by the holding member 30. The holding member 30 is fitted into and integrated with the rectangular frame-like radiator support 14. The front view of FIG. 3 corresponds to a state of the power generation device 10 as viewed from the front of the vehicle, when assembled to the radiator support 14 to be installed in the vehicle. In this state, the multiple power generating units 32 are oriented substantially vertically to be substantially perpendicular to the flow direction of the outside air 20 (the longitudinal direction of the vehicle). The power generating units 32 are arranged in the holding member 30 to be parallel with one another and spaced apart in the horizontal direction (the lateral direction of the vehicle), which is perpendicular to the flow direction of the outside air 20.

Figure 6:
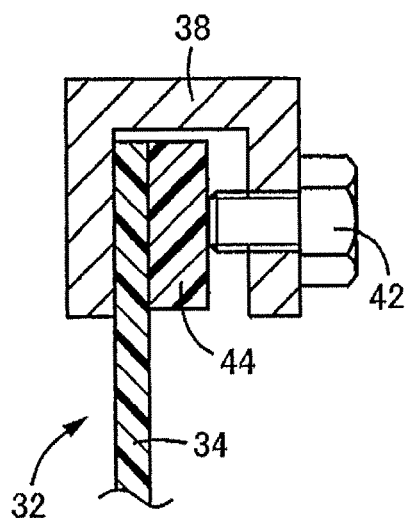
FIG. 6 is a cross-sectional view of an upper fixed portion of a power generating unit of the power generation device of FIG. 1.
Figure 7:
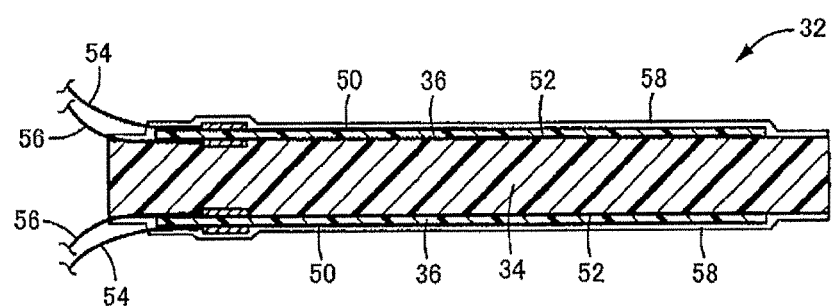
FIG. 7 is a cross-sectional view taken along a longitudinal axis, showing a power generating unit of the power generation device of FIG. 1.

As shown in FIG. 7, which is a cross-sectional view of a power generating unit 32 taken along the longitudinal axis, each power generating unit 32 includes an elastically deformable base member 34 and two piezoelectric films 36 bonded to both sides of the base member 34. The power generating unit 32 has a rectangular flat-plate shape and is attached to the holding member 30 at the opposite ends in the longitudinal direction with fixing members 38, 40, respectively. As shown in FIG. 6, which illustrates the fixing structure at the upper end, the fixing member 38 is made of metal such as aluminum and has a U-shaped cross-section. A bolt 42 is screwed into a side wall of the U-shaped cross-section of the fixing member 38, so that a fixing plate 44, which is made of a plastic material such as nylon, integrally pinches and fixes the end of the power generating unit 32 with the other wall of the fixing member 38. The fixing member 38 and the fixing plate 44 each have a length that is substantially equal to the width of the power generating unit 32 and are integrally fixed to the fixing member 38 over the entire width of the power generating unit 32. As in the case of the upper end, the lower end of the power generating unit 32 is fixed to the fixing member 40 via a bolt and a fixing plate.

The fixing members 38 and 40 are fixed to the holding member 30 such that the vertical position of at least one of the fixing members 38 and 40 is adjustable to apply a predetermined tensile force in the longitudinal direction (vertical direction) to the power generating unit 32. The power generating unit 32, the ends of which are fixed to the fixing members 38, 40, has a rectangular standard flat-plate shape when not being influenced by the outside air 20. The deformation characteristics and the power generation characteristics of the power generating units in relation to the flow of the outside air 20 are adjustable by changing the tensile force. The tensile force is determined in advance, for example, through experiments. Since the deformation characteristics and the power generation characteristics of the power generating units vary depending on the wind velocity (vehicle speed) of the outside air 20, a combination of power generating units 32 of different tensile forces can achieve efficient power generation in a wide range of wind velocities. Urging members such as springs may be used to apply tensile force to the power generating units 32. The fixing members 38, 40 are arranged in the holding member 30 to be parallel with the vehicle longitudinal axis, which is substantially parallel with the flow direction of the outside air 20. Thus, the power generating units 32 are held to be in a fixed orientation by the holding member 30 such that the flat surfaces of the flat plate shapes of the power generating units 32 are parallel with each other and substantially parallel with the flow direction of the outside air 20. The fixing members 38, 40 may be arranged in the holding member 30 to pivot, for example, about substantially vertical axes within a predetermined angular range (for example, a range of approximately ±15° about the longitudinal axis of the vehicle), so that the power generating units 32 are pivotal.

The base member 34, which is part of the power generating unit 32, is an elastic body made, for example, of an elastomer having a Shore-A (durometer type A) hardness in a range from 15 to 65. The deformation characteristics and the power generation characteristics of the power generating unit in relation to the flow of the outside air 20 are adjustable by changing the hardness of the base member 34. The hardness is determined in advance, for example, through experiments. The power generating units 32 are constituted by the base members 34 made of the same material having substantially the same hardness. The two piezoelectric films 36 bonded to both sides of each base member 34 are made of a piezoelectric material having a piezoelectric effect such as polyvinylidene difluoride (PVDF). Electrode films 50, 52, which are made, for example, of aluminum, are provided on both sides of the piezoelectric film 36 through vapor deposition, sputtering, or application of an electrically conductive paste, and electric wires 54, 56 are connected to the electrode films 50, 52, respectively. The surface of each power generating unit 32 is coated with a coating material 58, which is, for example, non-conductive plastic.

Figure 8:
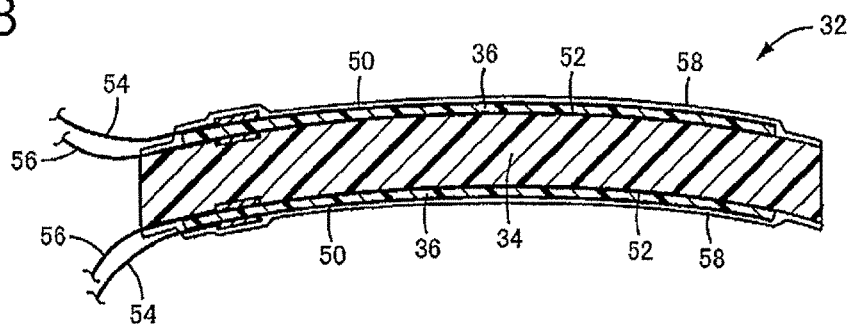
FIG. 8 is a cross-sectional view showing a warped state of the power generating unit of FIG. 7.
Figure 9A:
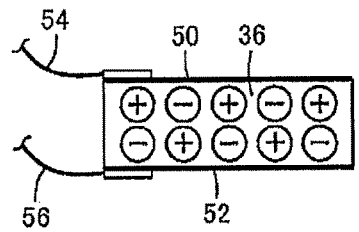
FIG. 9 is an explanatory diagram showing the principle of power generation by the power generating unit.
Figure 9B:
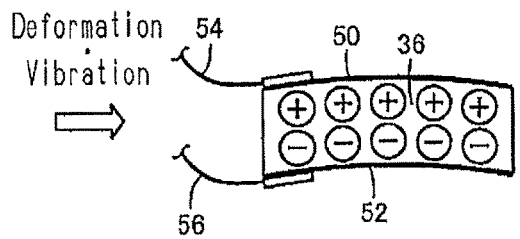
Figure 10:
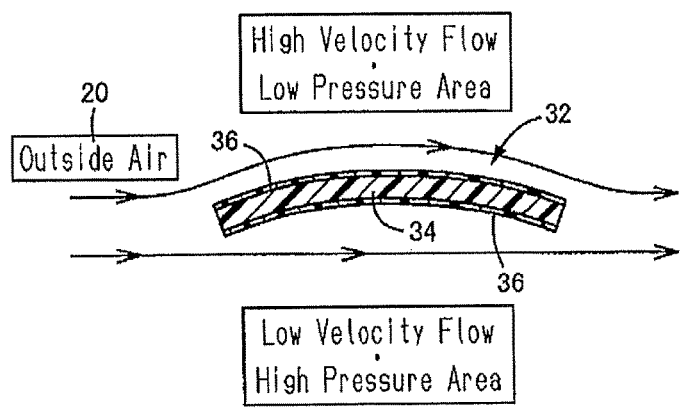
FIG. 10 is an explanatory diagram showing the principle of vibrations of the power generating unit, which is arranged to be parallel with the flow direction of outside air.
Figure 10:
Figure 10:
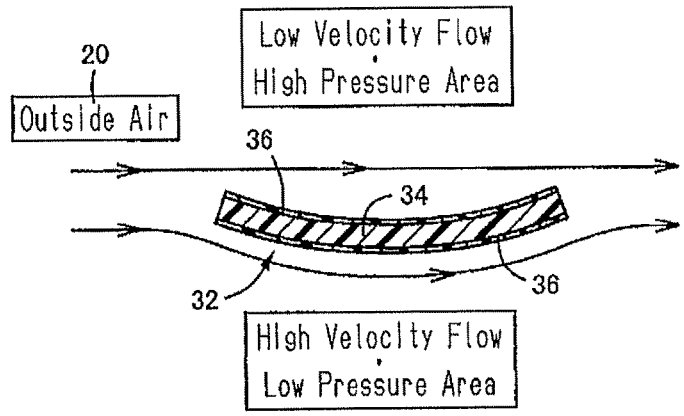
Figure 11:
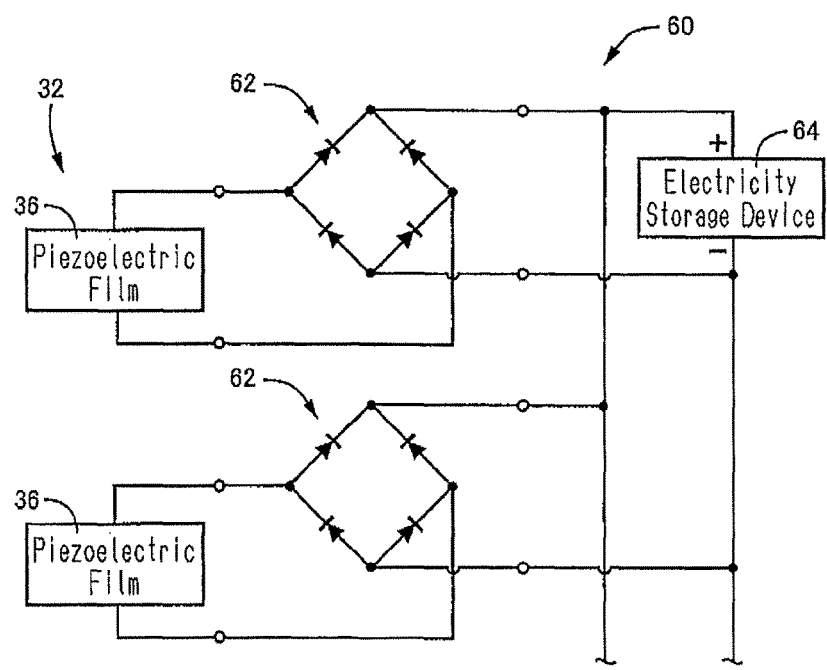
FIG. 11 is a circuit diagram showing a part of the electric circuit provided in the power generation device of FIG. 1.

When the base member 34 of the thus structured power generating unit 32 is elastically deformed in the thickness direction by the flow of the outside air 20, the piezoelectric films 36 are warped accordingly. This generates electromotive force between the two electrode films 50, 52. FIG. 8 illustrates one example of an elastically deformed state of the power generating unit 32 of FIG. 7, in which the intermediate portion in the longitudinal direction projects upward. As indicated by the change from FIG. 9A to FIG. 9B, charges in the piezoelectric film 36 are polarized to generate a potential difference. FIG. 10 includes cross-sectional views along arrows X in FIG. 3 of the power generating unit 32, which is arranged to be substantially parallel with the flow direction of the outside air 20. When the intermediate portion in the longitudinal direction of the power generating unit 32 is elastically deformed toward one side in the thickness direction (deformed state I) by a pressure difference generated by the flow of the outside air 20, the elasticity produces a force in the opposite direction. The power generating unit 32 is then deformed toward the other side in the thickness direction (deformed state II). The deformed state I and the deformed state II are alternately and repeatedly occur, so that the power generating unit 32 vibrates as indicated by arrow A in FIG. 3, which repeatedly changes the polarization of charges and continuously generates power. The characteristic frequency can be adjusted by the length or the tensile force of the power generating unit 32 to cause resonance to occur under a certain condition. FIG. 11 shows one example of an electric circuit 60 of the power generation device 10, which corresponds to one of the power generating units 32. The electric circuits 60 include bridge rectifier circuits 62, which rectify currents to charge an electricity storage device 64 such as a battery. Since positive and negative of the potential difference generated between the two piezoelectric films 36 on the opposite sides of the base member 34 change according to a definite relationship, one of the bridge rectifier circuits 62 may be omitted, so that rectification is performed by a common single bridge rectifier circuit 62.

The above described power generation device 10 for a vehicle uses the flat-plate shaped power generating units 32, each of which includes an elastically deformable base member 34 and piezoelectric films 36, and the base member 34 and the piezoelectric films 36 are laminated alternately. When the base member 34 is elastically deformed in the thickness direction by the flow of the outside air 20, the piezoelectric films 36 are warped to generate power. The power generation device 10 is therefore light and compact. The multiple power generating units 32 are arranged in the vehicle lateral direction, which intersects the flow direction of the outside air 20, and spaced apart. The power generating units 32 are also held by the holding member 30 such that the flat surfaces of the flat-plate shapes are oriented substantially parallel with the flow direction of the outside air 20. This structure allows the power generating units 32 to be densely arranged in close proximity to one another while limiting increase in the traveling resistance of the vehicle. As a result, a great electromotive force is ensured.

Further, the multiple power generating units 32 are arranged in the holding member 30 to be in the fixed orientation at which the flat surfaces of the flat-plate shapes are parallel with each other and substantially parallel with the flow direction of the outside air 20. This allows the multiple power generating units 32 to be densely arranged without contacting each other, so that a greater electromotive force can be ensured in the limited arrangement space.

Also, each power generating unit 32 has an elongated flat-plate shape and is oriented such that its longitudinal axis is substantially perpendicular to the flow direction of the outside air 20. In this state, the upper and lower ends in the longitudinal direction are held by the holding member 30. Thus, the intermediate portion in the longitudinal direction of each power generating unit 32 is vibrated in a favorable manner by the flow of the outside air 20 in a reciprocal manner in the thickness direction. The power generating unit 32 therefore efficiently generates power.

Further, the holding member 30 has a rectangular frame-like shape as viewed from the front of the vehicle. The holding member 30 holds the power generating units 32 such that the longitudinal direction of the vehicle agrees with the flow direction of the outside air 20. This facilitates handling of the power generation device 10. That is, the present embodiment relates to an electric vehicle, which requires no radiator. Thus, the power generation device 10 can be installed in the vehicle by being assembled to the radiator support 14, which is no longer necessary. Thus, the power generation device 10 can be easily and inexpensively installed in the vehicle using conventional parts.

Other embodiments according to the present invention will now be described. In the following embodiments, like or the same reference numerals are given to those components that are like or the same as the corresponding components of the above illustrated embodiment and detailed explanations are omitted.

Figure 12:
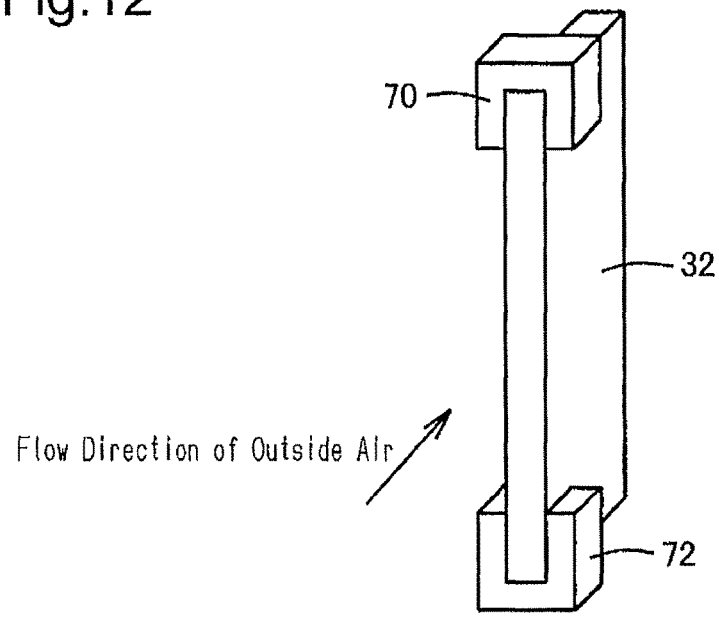
FIG. 12 is a diagrammatic perspective view illustrating a case in which only the upstream-side parts in the flow direction of outside air in the opposite ends in the longitudinal direction of the power generating unit are fixed.

Fixing members 70, 72 shown in FIG. 12, which are used to attach the power generating unit 32 to the holding member 30, are different from the equivalent members in the above illustrated embodiment. Specifically, the fixing members 70, 72 are shorter than the fixing members 38, 40. In the width direction of the power generating unit 32, that is, in the vehicle longitudinal direction, only a part located on the upstream side in the flow direction of the outside air 20 (the front side in the vehicle) is fixed with a bolt and a fixing plate (neither is shown). Therefore, with respect to the width direction of the power generating unit 32, a part that is located on the downstream side in the flow direction of the outside air 20 can be freely deformed in the thickness direction from the upper end to the lower end. Accordingly, the deformation range of the piezoelectric films 36 is increased, so that power is generated further efficiently.

Figure 13:
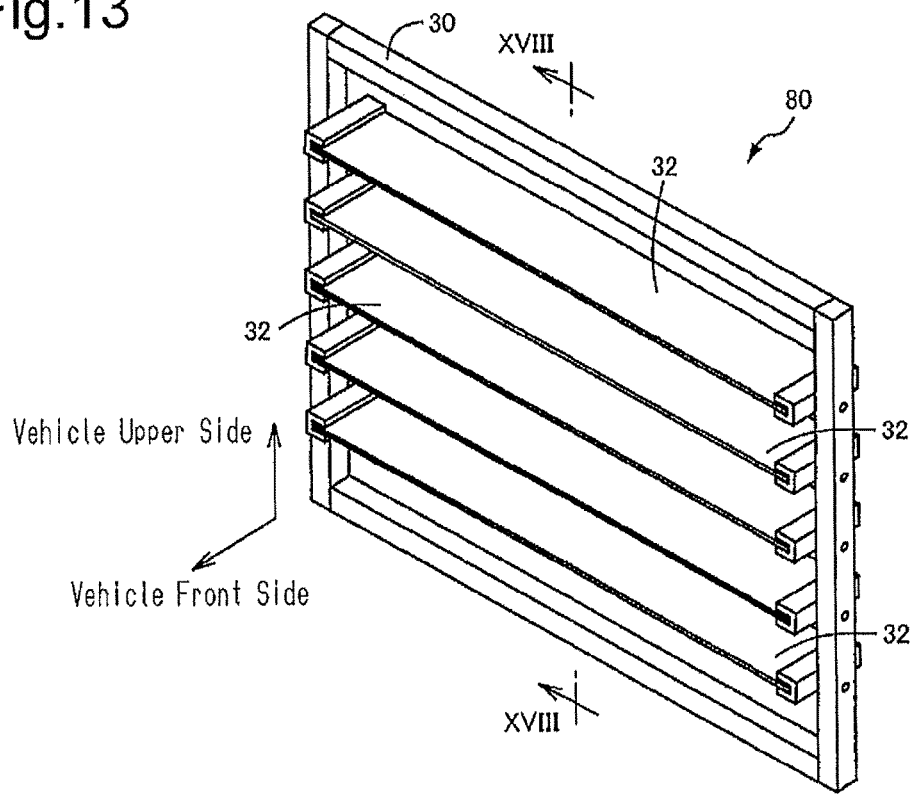
FIG. 13 is a diagrammatic perspective view showing one example of a power generation device for a vehicle, in which multiple power generating units are arranged horizontally.

A power generation device 80 shown in FIG. 13 includes multiple power generating units 32, which are oriented such that the longitudinal axes agree with the vehicle lateral direction and that the flat surfaces are substantially horizontal. The opposite ends in the vehicle lateral direction are fixed to the holding member 30. The power generation device 80 has the same advantages as those of the above illustrated embodiment.

Figure 14:
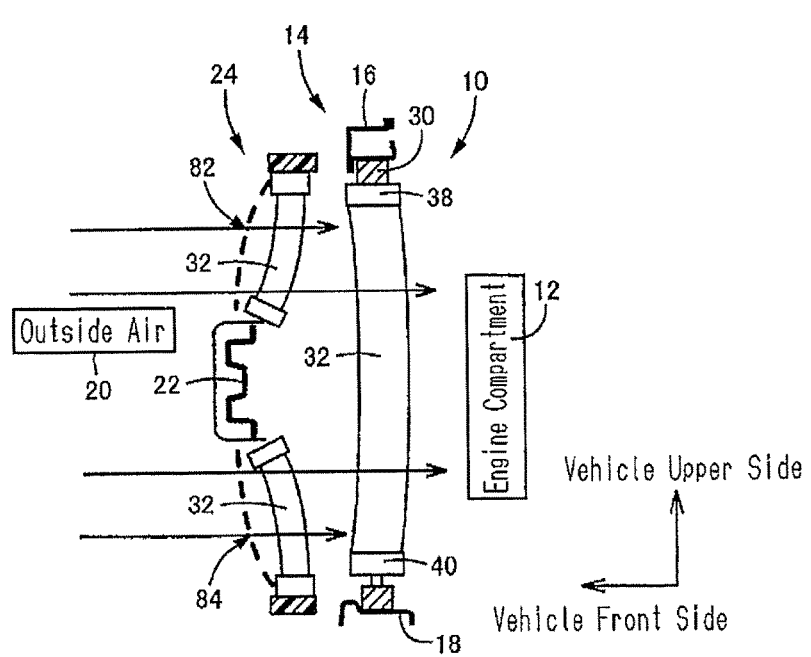
FIG. 14 is an explanatory cross-sectional view corresponding to FIG. 2, showing another embodiment of the present invention.

FIG. 14 illustrates an embodiment in which, in addition to the power generation device 10 arranged in the radiator support 14, two power generating devices 82, 84 are arranged between the power generation device 10 and the front grille 24. The power generating devices 82, 84 are arranged above and below the bumper reinforcement 22, respectively, and have power generating units 32. In this case, power is generated further efficiently. Unlike electric vehicles, some automobiles (hybrid vehicles, plug-in hybrid vehicles, gasoline vehicles, and diesel vehicles) require a radiator. Such an automobile may be equipped with only the two power generating devices 82, 84 to achieve the same advantages as those of the above illustrated embodiment.

Figure 15:
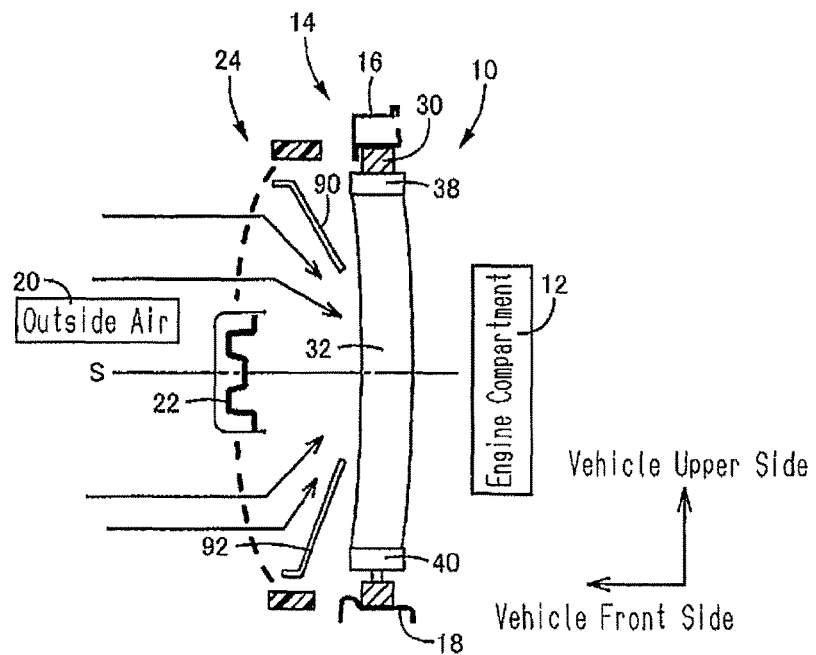
FIG. 15 is an explanatory cross-sectional view corresponding to FIG. 2, showing another embodiment of the present invention.

FIG. 15 illustrates an embodiment in which wind guide plates 90, 92 are provided between the power generation device 10 and the front grille 24 to conduct the outside air 20 to the center of the power generation device 10 in the vertical direction. Each of the wind guide plates 90, 92 has an inclined portion. The distance between each inclined portion and the central axis S, which extends in the vehicle longitudinal direction through the center of the bumper reinforcement 22, decreases toward the rear end of the vehicle. The central axis S extends through a part of the power generation device 10 that includes the center, and the wind guide plates 90, 92 are inclined toward the center of the power generation device 10 toward the rear end of the vehicle. In this case, the wind velocity of the outside air 20 when passing through the power generation device 10 is increased. The outside air 20 is also passes through the center portions of the power generating units 32 in a concentrated manner and is likely to produce turbulence such as swirls. As a result, the amount, the speed, and the frequency of deformation are increased. Thus, power is generated further more efficiently.

Figure 16:
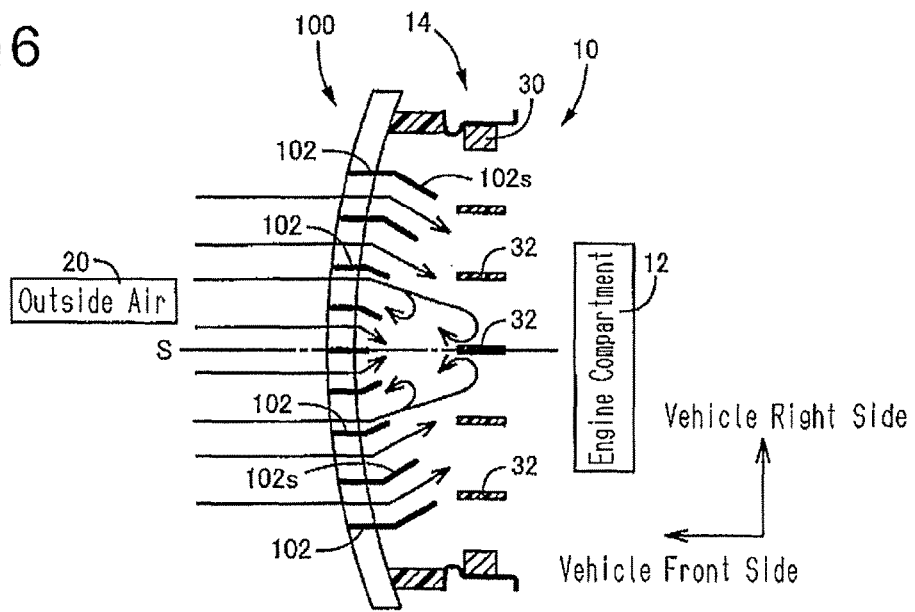
FIG. 16 is an explanatory cross-sectional view of a part corresponding to the cross-sectional view along arrows XVI in FIG. 1, showing another embodiment of the present invention.
Figure 17:
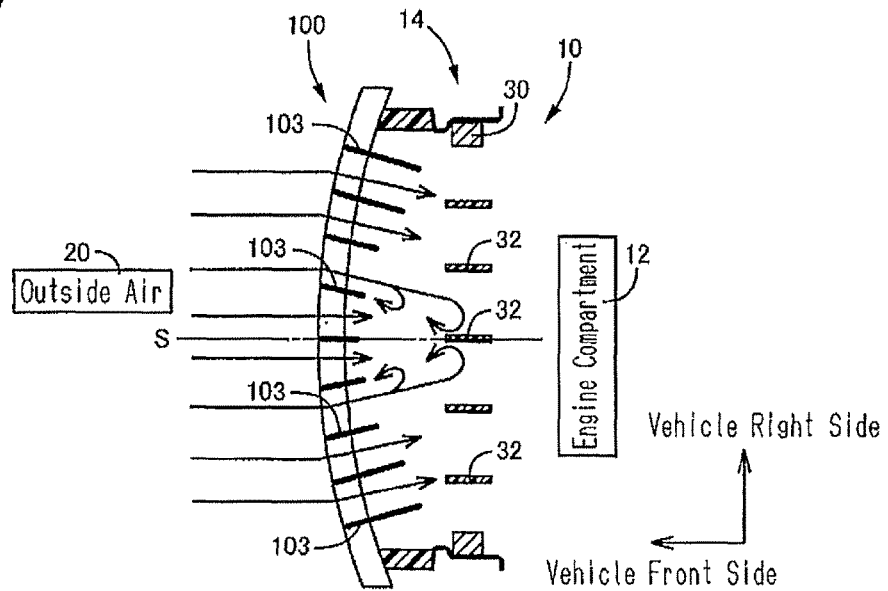
FIG. 17 is an explanatory cross-sectional view corresponding to FIG. 16, showing another embodiment of the present invention.

FIG. 16 is a cross-sectional view of a part corresponding to the cross-sectional view along arrows XVI in FIG. 1, showing an embodiment in which a front grille 100 is used. The front grille 100 has multiple substantially vertical fins 102 spaced apart in the vehicle lateral direction. In this case, the power generation device 10 has multiple substantially vertically arranged power generating units 32, the upper and lower ends of which are fixed to the holding member 30. When viewed from the front of the vehicle, the power generating units 32 are substantially parallel with the vertical fins 102. Thus, the outside air 20, which is drawn in through the clearances between the vertical fins 102, efficiently deforms the power generating units 32, so that a high power generating efficiency is obtained. The vertical fins 102 each have an inclined portion 102s, which is inclined inward with respect to the vehicle lateral direction, such that the distance between the inclined portion 102s and the central axis S decreases toward the rear end of the vehicle. Thus, the introduced outside air 20 is caused to pass through the center portion of the power generation device 10 with respect to the vehicle lateral direction, that is, through a part in which the power generating units 32 are arranged, in a concentrated manner so that the wind velocity is increased. This is likely to produce turbulence such as swirls. As a result, the amount, the speed, and the frequency of deformation of the power generating units 32 are increased. Thus, power is generated further more efficiently. In an embodiment shown in FIG. 17, vertical fins 103 are provided that are entirely inclined such that the distance between each vertical fin 103 and the center axis S decreases toward the rear end of the vehicle. This configuration achieves the same operation and advantages as the embodiment shown in FIG. 16. Each vertical fin 103 entirely corresponds to an inclined portion.

Figure 18:
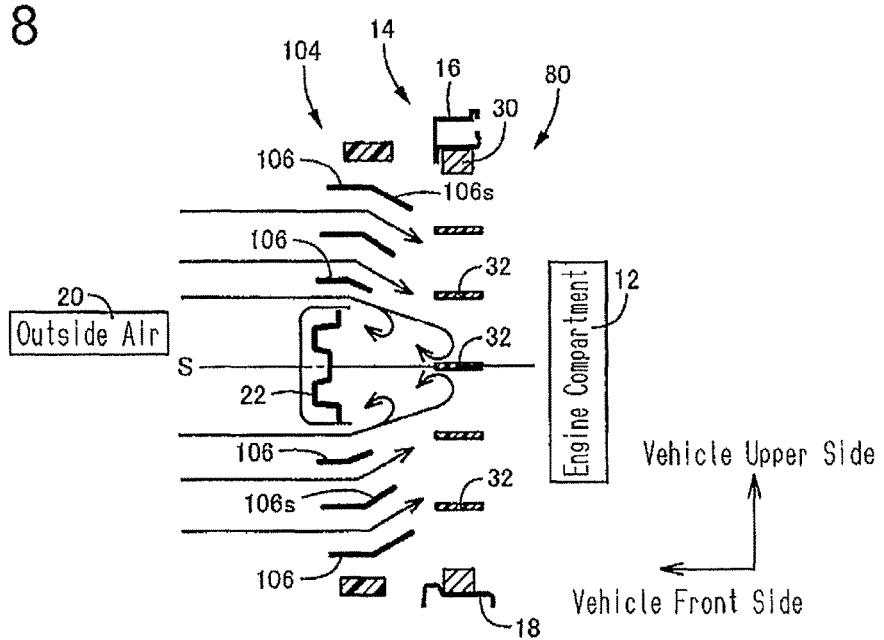
FIG. 18 is an explanatory cross-sectional view of a part corresponding to the cross-sectional view along arrows XVIII in FIG. 13, showing another embodiment of the present invention.
Figure 19:
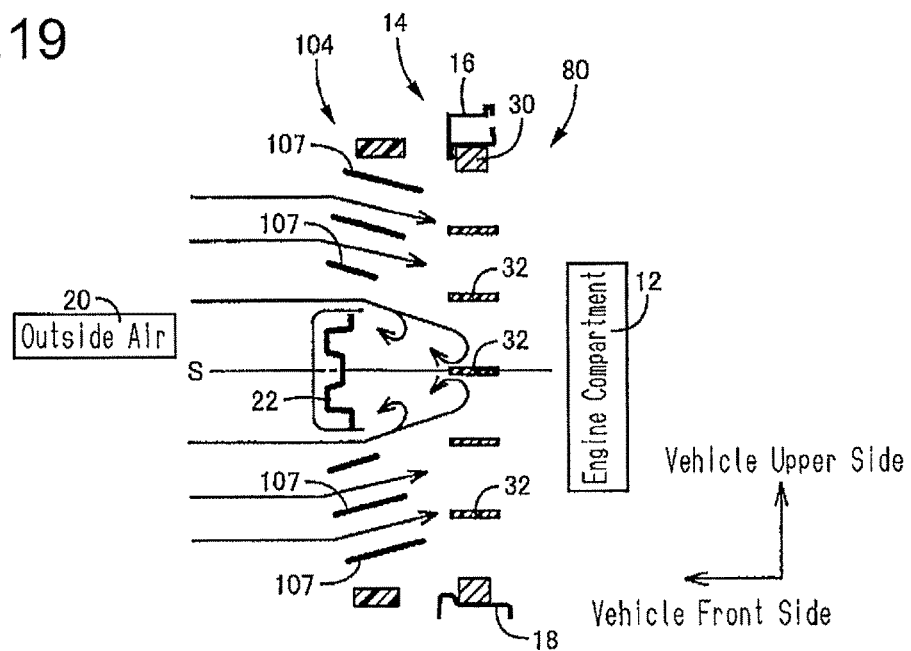
FIG. 19 is an explanatory cross-sectional view corresponding to FIG. 18, showing another embodiment of the present invention.

FIG. 18 is a cross-sectional view of a part corresponding to the cross-sectional view along arrows XVIII in FIG. 13, showing an embodiment in which a front grille 104 is used. The front grille 104 has multiple substantially horizontal lateral fins 106 spaced apart in the vehicle vertical direction. In this embodiment, the power generation device 80 has multiple substantially horizontally arranged power generating units 32, the left and right ends of which are fixed to the holding member 30. When viewed from the front of the vehicle, the power generating units 32 are substantially parallel with the lateral fins 106. Thus, the outside air 20, which is drawn in through the clearances between the lateral fins 106, efficiently deforms the power generating units 32, so that a high power generating efficiency is obtained. The lateral fins 106 each have an inclined portion 106s, which is inclined inward with respect to the vertical direction, such that the distance between the inclined portion 106s and the central axis S decreases toward the rear end of the vehicle. Thus, the introduced outside air 20 is caused to pass through the center portion of the power generation device 80 with respect to the vehicle vertical direction, that is, through a part in which the power generating units 32 are arranged, in a concentrated manner so that the wind velocity is increased. This is likely to produce turbulence such as swirls. As a result, the amount, the speed, and the frequency of deformation of the power generating units 32 are increased. Thus, power is generated further more efficiently. In an embodiment shown in FIG. 19, lateral fins 107 are provided that are entirely inclined such that the distance between each lateral fin 107 and the center axis S decreases toward the rear end of the vehicle. This configuration achieves the same operation and advantages as the embodiment shown in FIG. 18. Each lateral fin 107 entirely corresponds to an inclined portion.

Figure 20:
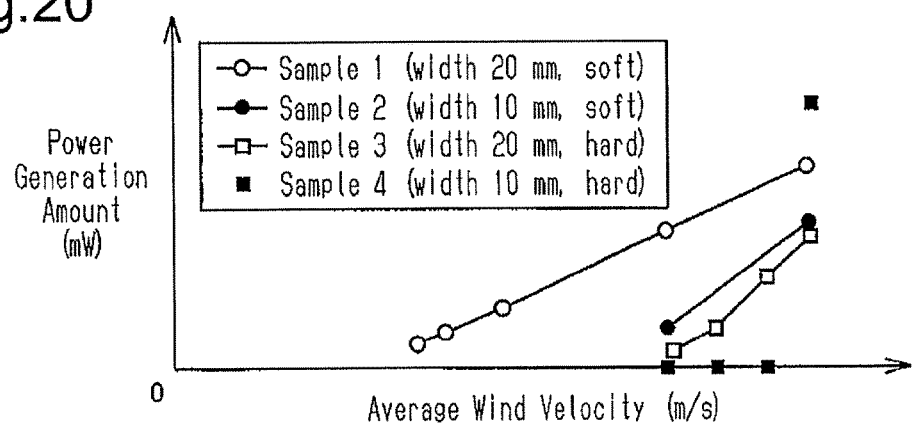
FIG. 20 is a diagram showing the results of tests in which the power generation amounts of four samples 1 to 4 having different widths and hardnesses were measured while changing the wind velocity.

FIG. 20 shows the results of tests on the power generation characteristics in relation to the wind velocity, in which the material (hardness) and the width of the base member 34 of the power generating unit 32 were changed. "Soft" specimens had a Shore-A hardness of 15, and "hard" specimens had a Shore-A hardness of 60. The results show that, in a low wind velocity range, that is, at lower vehicle speeds (less than approximately 40 km), ones that had a low hardness of approximately Shore-A hardness of 15 and a wide width (approximately 20 mm) were appropriate, and that, in a high wind velocity range, that is, at higher vehicle speeds (greater than or equal to approximately 40 km), ones that had a high hardness of approximately Shore-A hardness of 60 and a narrow width (approximately 10 mm) were appropriate. That is, the deformation characteristics and power generation characteristics of the power generating unit 32 in relation to the wind velocity of the outside air 20 vary depending on the hardness and the width of the base member 34. Thus, a combination of different types of power generating units 32 having several types of base members 34 of different hardnesses and widths achieves efficient power generation in a wide range of wind velocity (range of vehicle speed).

Figure 21:
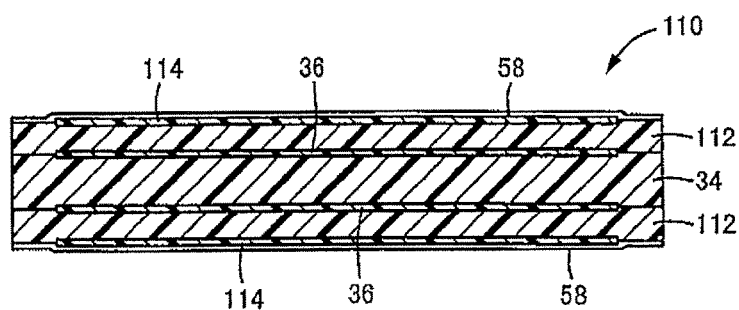
FIG. 21 is an explanatory cross-sectional view corresponding to FIG. 7, showing a power generating unit according to another embodiment.
Figure 22:
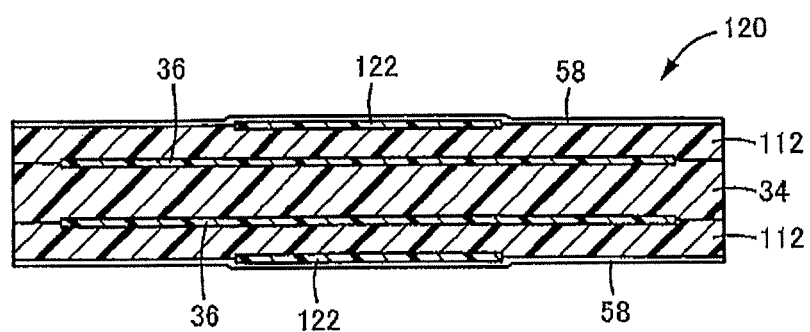
FIG. 22 is an explanatory cross-sectional view corresponding to FIG. 7, showing a power generating unit according to yet another embodiment.

FIGS. 21 and 22 are explanatory cross-sectional views corresponding to FIG. 7, showing power generating units according to other embodiments. The power generating unit 110 of FIG. 21 is different from the power generating unit 32 of the above illustrated embodiment in that additional two base members 112 are laminated on the (outer) surfaces of the two piezoelectric films 36, which are laminated on the opposite sides of the base member 34. Also, a piezoelectric film 114 is laminated on each of the base members 112. The power generating unit 110 therefore has seven-layer structure. The base members 112 and the piezoelectric films 114 are respectively made of the same materials as the base member 34 and piezoelectric films 36. The base members 112 have a smaller thickness than that of the base member 34 and are allowed to be elastically deformed in the thickness direction as a whole. In this case, the total of four piezoelectric films 36, 114 generate power, achieving an even higher power generation efficiency.

The power generating unit 120 of FIG. 22 is different from the above power generating unit 110 in that the power generating unit 120 has shorter piezoelectric films 122 on the outer side, and the piezoelectric films 122 are partly laminated on the center portions in the longitudinal direction. In other words, the piezoelectric films 122 are laminated only on the parts where the amount of deformation is great. This structure efficiently increases the power generating performance, while limiting increase in the stiffness of the overall power generating unit. This structure also minimizes the cost increase for piezoelectric films due to increase in the number of laminated layers.

The above described embodiments of the present invention are to be considered as merely examples and the invention but may be modified or improved based on knowledge of the person skilled in the art.

DESCRIPTION OF THE REFERENCE NUMERALS

10, 80, 82, 84 . . . Power Generation Device (Power Generation Device for Mobile Body)
20 . . . Outside air (External Fluid)
30 . . . Holding Member
32, 110, 120 . . . Power Generating Unit
34, 112 . . . Base Member
36, 114, 122 . . . Piezoelectric Films
100, 104 . . . Front Grille
102, 103 . . . Vertical Fins
102s . . . Inclined Portion
106, 107 . . . Lateral Fins
106s . . . Inclined Portion
S . . . Central Axis

The invention claimed is:

1. A power generation device for a mobile body that generates power based on a relative flow of an external fluid when the mobile body travels, the device comprising:
a plurality of flat-plate shaped power generating units, each of which includes an elastically deformable flat-plate shaped base member and a piezoelectric film, wherein the base member and the piezoelectric film are laminated alternately, and when the base member is elastically deformed in a thickness direction by a flow of the external fluid, the piezoelectric film is warped to generate power; and
a holding member, which is arranged in the mobile body, wherein the power generating units are arranged in a direction intersecting the flow direction of the external fluid and spaced apart, and the holding member holds the power generating units at a position where the external fluid flows such that flat surfaces of flat-plate shapes of the power generating units are oriented to be substantially parallel with the flow direction of the external fluid, wherein
each power generating unit has an elongated flat-plate shape,
opposite ends of the power generating unit in a longitudinal direction are held by the holding member such that the power generating unit is in an orientation in which a longitudinal axis is substantially perpendicular to the flow direction of the external fluid,
a fixing member is provided at each of the opposite ends in the longitudinal direction of each power generating unit,
the power generating units are arranged in the holding member via the fixing members to pivot in accordance with the flow of the external fluid, and
with respect to a width direction, which is perpendicular to the longitudinal direction, a part in the opposite ends of the elongated flat-plate shape in the longitudinal direction that is located on an upstream side in the flow direction of the external fluid is fixed to the fixing member, and a part that is located on a downstream side is movable in a thickness direction and relative to the fixing member.

2. The power generation device for a mobile body according to claim 1, wherein
the holding member has a rectangular frame-like shape as viewed from a front of the mobile body, and
the holding member holds the power generating units such that the longitudinal direction of the mobile body agrees with the flow direction of the external fluid.

3. The power generation device for a mobile body according to claim 1, wherein
the mobile body is a vehicle with a front grille having substantially horizontal lateral fins or substantially vertical fins,
the power generation device is arranged rearward of the front grille,
the power generating units are oriented such that the flat surfaces are substantially parallel with the fins,
as viewed from the front of the vehicle, opposite ends of the power generating units in a direction parallel with the fins are held by the holding member, and
the power generating units generate power by being deformed by a flow of the outside air that is drawn in through clearances of the fins.

4. The power generation device for a mobile body according to claim 3, wherein, in a cross-sectional view taken along a longitudinal axis of the vehicle, each fin has an inclined portion, wherein a distance between the inclined portion and a center of the power generation device decreases toward a rear end of the vehicle.

* * * * *